United States Patent [19]

Ôizumi et al.

[11] Patent Number: 5,106,794
[45] Date of Patent: Apr. 21, 1992

[54] ZIRCONIUM OXIDE SINTER FOR FORMING THIN FILM THEREOF AND METHOD FOR PRODUCTION OF THE SAME

[75] Inventors: Fukuo Ôizumi, Tendo; Kinitiro Uemura, Yamagata; Katuo Minoya, Yamagata; Akemi Katoh, Yamagata; Tutomu Uema, Shinnanyo, all of Japan

[73] Assignee: Tosoh Corporation, Yamaguchi, Japan

[21] Appl. No.: 323,914

[22] Filed: Mar. 15, 1989

[30] Foreign Application Priority Data

Mar. 15, 1988 [JP] Japan .................................. 63-59395
Feb. 16, 1989 [JP] Japan .................................. 1-35078

[51] Int. Cl.$^5$ .............................................. C04B 35/48
[52] U.S. Cl. ................................... 501/103; 501/104; 264/65
[58] Field of Search ................. 501/103, 104; 264/122

[56] References Cited

U.S. PATENT DOCUMENTS

| 3,175,919 | 3/1965 | Smoot et al. | 501/103 |
| 3,565,645 | 2/1971 | Anderson | 501/103 |
| 3,929,498 | 12/1975 | Hancock et al. | 501/103 |
| 4,344,904 | 8/1982 | Yamada et al. | 501/103 |
| 4,789,651 | 12/1988 | Sugie et al. | 501/103 |

FOREIGN PATENT DOCUMENTS

1155256  7/1986  Japan .................................. 501/103

*Primary Examiner*—Mark L. Bell
*Assistant Examiner*—M. Bonner
*Attorney, Agent, or Firm*—Sughrue, Mion, Zinn, Macpeak & Seas

[57] ABSTRACT

Zirconium oxide sinter for use in forming a thin film thereof by vapor deposition etc., having a purity not less than 99.0% by weight with unavoidable hafnium oxide and a density more than 4.9 g/cm$^3$. Desirably the sinter further contains calcium oxide in an amount from 50 to 2000 ppm. The sinter can produce a uniform zirconium oxide thin film which can be used in optical applications with superior characteristics.

3 Claims, No Drawings

ZIRCONIUM OXIDE SINTER FOR FORMING THIN FILM THEREOF AND METHOD FOR PRODUCTION OF THE SAME

BACKGROUND OF THE INVENTION

1. Field of the Invention

The present invention relates to a zirconium oxide ($ZrO_2$) sinter suitable for forming a thin film thereof and the method for production of the same. More specifically, the invention relates to a high purity zirconium oxide sinter suitable for use in, for example, vacuum evaporation coating and sputtering and relates to the method for production of the same.

The zirconium oxide ($ZrO_2$) thin film produced by vacuum evaporation coating or sputtering is applicable widely in optical uses because of its excellent properties, such as transparency, high hardness, high refractive index and high environmental resistance.

2. Description of the Related Art

Since $ZrO_2$ is subject to a phase transformation (monoclinic$\rightleftarrows$tetragonal) accompanying a large change in volume in a temperature range from 900°-1200 °C., it has conventionally been difficult to produce a high density sinter of pure $ZrO_2$. That is to say, for producing $ZrO_2$ sinter in the past, 3 mol % or more of a stabilizer such as CaO, MgO or $Y_2O_3$ was added for the purpose of stabilizing $ZrO_2$crystals in the tetragonal form, and the crystals were sintered at a temperature not lower than 1400 °C. so as to obtain stabilized (or partially stabilized) $ZrO_2$ sinter. However, these sinters contain unavoidably a relatively large quantity of the stabilizer, which lowers the purity, and therefore, the zirconium oxide film obtained therefrom by vacuum evaporation coating or sputtering is not satisfactory for use as an optical film because of low transparency and refractive index, in particular.

Several proposals have been presented for producing a $ZrO_2$ sinter having a density corresponding nearly to the true density of high purity $ZrO_2$ (monoclinic, density by X-ray: 5.83 $g/cm^3$), as disclosed by A. C. D. Chaklader and V. T. Baker, Am. Ceram. Soc. Bull., 44, 258-59 (1965); G. K. Bansal and A. H. Heuler, J. Am. Ceram. Soc. Bull., 58, 76-77 (1979); H. J. Garrett and R. Ruh, Am. Ceram. Soc. Bull., 47, 578-79 (1968); M. Yoshimura and S. Somiya, Am. Ceram. Soc. Bull., 59, 246 (1980); Murase, Kato and Hirano, J. Ceram. Soc., Japan, 91, 561-64 (1983). However, all of the proposed methods involve complicated processes such as the use of a hot press, reaction hot press, reoxidation after vacuum sintering, hydrothermal synthesis from Zr and water, and the use of superfine particles obtained by hydrolysis of $ZrOCl_2$, and therefore the production cost of the sinter by these methods is unavoidably very high. Moreover, the sinter products obtained according to these methods suffer residual stress which makes them very susceptible to cracking in the course of their production process, and consequently, a large size sinter suitable for producing a thin film thereof cannot be obtained, and further the sinter products thus obtained very easily crack when they are used as the source for vacuum evaporation coating and the target for sputtering. Accordingly, it has been a common practice to use a sinter product with a density of not more than 4.9 $g/cm^3$ (or generally 4.0-4.5 $g/cm^3$) for producing a high purity $ZrO_2$ film. However, in using such a sinter product as an evaporation source for radiation-type vacuum evaporation coating with the use of an energy beam such as an electron beam (hereinafter will be called in short as EB), there will be such a defect that a uniform film can hardly be obtained due to the formation of large recesses on the surface of the evaporation source where the beam is directly radiated when the beam power is increased, and further in the case of applying such a sinter product as the evaporation source in a resistance heating-type vacuum coating process and the target in the sputtering process a uniform film can also hardly be obtained due to the influence of a large amount of gas absorbed in the low-density sinter. Moreover, the sinter products obtained by the prior art have only a short life as the source for the formation of a thin film thereof, and are thus very low in productivity.

DETAILED DESCRIPTION OF THE INVENTION

Under such circumstances, the object of the present invention is to offer an excellent $ZrO_2$ sinter for the formation of a thin zirconium oxide film by means of vapour deposition or sputtering and the method for production of the same.

The present inventors made extensive investigations and studies for solving the problems mentioned hereinabove and found that while $ZrO_2$ powders shows a high sinterability, the density of the resultant sinter can be controlled to obtain an optimum density for producing a thin film thereof by lowering its sinterability appropriately by controlling the sintering condition. The present invention has been completed on the basis of this finding. Namely, the present invention provides $ZrO_2$ sinter suitable for the formation of thin film thereof, having a density more than 4.9 $g/cm^3$ and a purity of 99.0 wt. % or higher including unavoidably contained hafnium oxide ($HfO_2$) as an impurity and provides a method for producing the same. The invention will be described in more details herein below.

The $ZrO_2$ sinter according to the present invention has, as one of its features, a density more than 4.9 $g/cm^3$. Accordingly, when the $ZrO_2$ sinter is used as the evaporation source for the radiation-type vacuum coating with the use of such energy as EB, it is free from the formation of large surface unevenness and cracks on the beam radiated surface, and accordingly a uniform vacuum coating film can be obtained. Further since the sinter according to the present invention contains only little gas absorbed therein a uniform film can consistently be obtained when it is used as the evaporation source for resistance heating-type vacuum coating and as the target for sputtering, and since the sinter has an appropriate density as above mentioned, the working life thereof as the evaporation source or target can also be prolonged. Thus, the productivity of the film can be elevated. When the density of the sinter exceeds 5.3 $g/cm^3$, residual stress will be present in the sinter, causing much likelihood of the formation of cracks in the course of its production and during its use, so that the desirable density is in the range of 4.9-5.3 $g/cm^3$. On the other hand, when a sinter with a density of lower than 4.9 $g/cm^3$ is used as the evaporation source or the target for the production of $ZrO_2$ film, the resultant film is inconsistent in quality.

The $ZrO_2$ sinter according to the present invention does not contain a large amount of stabilizer, and has a purity of 99.0 wt. % or higher including unavoidable hafnium oxide. Accordingly, the $ZrO_2$ film obtained therefrom is very excellent in the characteristic properties required as an optical film, such as transparency and high refractive index. The reason why the sinter according to the present invention requires no need of adding a large quantity of stabilizer is that the $ZrO_2$ sinter is appropriately moderated in the sintering degree and has enough porosity bearable for the volume change due to the phase transformation, and accordingly there is no need of purposely stabilizing the crystals of the sinter.

As above described, the sintering degree of the $ZrO_2$ sinter is lowered suitably so as to avoid any residual stress, so that, even in the case of a large size sinter, as maybe required by the vacuum coating apparatus or by the sputtering apparatus, where the surface of the largest area of the sinter is not less than 20 cm$^2$ and the length of the shortest side thereof is not less than 5 mm, the sinter will not suffer cracks in the course of its production and use. Such a large size sinter having a density more than 4.9 g/cm$^3$ and a purity not less than 99.0 wt. % is novel and could not be produced by the conventional art.

From the reasons as above mentioned, the $ZrO_2$ sinter for forming a thin film thereof according to the present invention can be made into desired sizes, has an elongated working life, and is free from occurrence of surface defects and formation of cracks due to the radiation of the beam thereon during its use. Further, since the amount of gas absorbed in the sinter is only a little, the sinter can be used advantageously as the evaporation source of EB and resistance-heating vacuum coating and the target of sputtering.

After extensive investigations on the method for producing the high purity $ZrO_2$ sinter for the formation of its thin film, the present inventors further found that the high sinterability of $ZrO_2$ can be weakened and a $ZrO_2$ sinter having a density of 4.9 g/cm$^3$ or higher can conveniently be obtained by controlling the grain size of $ZrO_2$ powders used as the raw material or by adding CaO to the raw material powders. Namely, the present method for producing a $ZrO_2$ sinter for the use of producing its thin film comprises forming at room temperatures and then sintering zirconium oxide powders having a purity not less than 99.0% by weight with unavoidable hafnium oxide and having a secondary particle size distribution comprising not less than 30% by weight of the particles in the range of 10 to smaller than 40 $\mu$m, and not less than 2% by weight of particles smaller than 1 $\mu$m. According to a preferable modification of the method, CaO is added in an amount of 50-2000 ppm to the $ZrO_2$ powders.

CaO is effective to lower the sinterability of the $ZrO_2$ powders, but when its content exceeds 2000 ppm, there is a danger that cracks are formed in the sinter in the course of producing the same and during its use.

In the present invention, any conventional method can be applied for producing the raw $ZrO_2$ powders but it is desirable to produce the powders by calcining zirconium hydroxide ($ZrO_2.xH_2O$) from the standpoint of simplification of the production process and lowering of the production cost.

By selecting the particle size distribution of $ZrO_2$ powders as above mentioned, the coarse particles contained in a relatively large amount in the powders are effective to lower the sintering degree, and simultaneously the very fine powders contained in a small amount serve to keep a suitable degree of sintering, and thus the sinterability of $ZrO_2$ powders can be controlled appropriately for forming the thin film thereof with desirable properties.

Addition of CaO to the $ZrO_2$ powders works to inhibit the sintering of the $ZrO_2$ powders. In this case, therefore, the addition amount of CaO is to be restricted as above mentioned in the range of 50-2000 ppm. When the particle size distribution of the $ZrO_2$ powders is adjusted as above mentioned, the addition of CaO may be dispensed with, but when the particle size distribution of the $ZrO_2$ powders is not adjusted, the addition of CaO in the above is preferable. Less than 50 ppm of CaO has no effect on the control of sinterability. Additionally, CaO is effective to stabilize the $ZrO_2$ crystals in the tetragonal form, and accordingly, with the addition of an excessively large amount of CaO, the phase transformation from tetragonal to monoclinic does not proceed in the normal transformation temperature range of 900°-1200° C., causing the phenomenon of supercooling, and the phase transformation accompanying large expansion proceeds suddenly at a lower temperature. Therefore, when the addition of CaO exceeds 2000 ppm, fine cracks are easily formed in the resultant $ZrO_2$ sinter. No specific method is required for the addition of CaO, but since the mixing in a dry state such as by using a mixer, ball mill, etc., causes the tendency of segregation, the addition in wet a state such as by addition of Ca salts to $ZrO_2$ containing slurries is desirable. A method of mixing of two kinds of $ZrO_2$ powders, one with a high CaO concentration and the other with a low CaO concentration, may also be adopted.

Then, the $ZrO_2$ powders thus obtained are formed at room temperatures by known methods such as by means of the cold isostatic pressing of a preliminarily formed article formed from the powders by means of uniaxial pressing in a metal mold, or the powders directly for forming, such defects as the warp and the irregularity of density caused in the course of sintering are controlled, the density of the resultant sinter can be elevated, and further the sintering time is shortened and undesirable particle growth can be prevented. The forming pressure in cold isostatic pressing is desirably not less than 800 kg/cm$^2$, and in the case of the combined use of a metal mold, it is desirable that the pressure applied to the metal mold is not less than 100 kg/cm$^2$.

By sintering the thus formed body, the final sinter is obtained. The sintering temperature is not limited so long as the temperature is not lower than 1000° C. However, in the case when the temperature is higher than 1400° C., the sintering proceeds too far, causing the formation of cracks in the resultant sinter, so that it is desirable that the sintering temperature is not higher than 1400° C. On the other hand, when the sintering temperature is lower than 1000° C., the sintering hardly proceeds, causing the breakdown of the resultant sinter. It is desirable that the sinter is held at the sintering temperature for one hour or longer.

With the $ZrO_2$ sinter produced by the above mentioned method, it is possible to render the density of the sinter to more than 4.9 g/cm$^3$, but when the density is too high, there is a tendency that the resultant sinter is vulnerable to thermal shock, so that it is desirable to control the density to not more than 5.3 g/cm$^3$, and the control of density can be done suitably by controlling the sintering temperature.

By the method as above described, the sinter with a controlled degree of sintering, suitable for the formation of a thin film therefrom, can be produced simply.

The sinter according to the present invention can be used most advantageously for the purpose of producing a thin film thereof by such a method as vacuum evaporation coating and sputtering. With the use of the sinter, a uniform thin film of $ZrO_2$ having superior characteristics as an optical film can be obtained with high productivity, and the working life of the sinter is greatly elongated.

DETAILED DESCRIPTION OF THE PREFERRED EMBODIMENTS

The present invention will be better understood from the following description of preferred embodiments, but of course the invention is not limited thereto.

EXAMPLE 1

$ZrO_2$ powders used as starting material:

| Purity (including $HfO_2$): 99.0 wt. % | |
|---|---|
| Particle distribution (in wt. %, determined by the sedimentation method) | |
| Smaller than 1 μm: | 8% |
| 1 to smaller than 10 μm: | 23% |
| 10 to smaller than 40 μm: | 51% |
| Not smaller than 40 μm: | 18% |

To 100 parts by weight of the $ZrO_2$ powders, 2 parts by weight of wax was added to obtain a mixture to be formed. 510 g of the mixture was preliminarily formed under a pressure of 200 kg/cm² in a metal mold, and then formed by means of a cold isostatic press under a pressure of 2000 kg/cm² to obtain a formed body with a density of 3.18 g/cm³. The pressed body, after dewaxing, was introduced in a sintering furnace and sintered for 6 hours at a temperature of 1250° C. The sinter thus obtained had a size of 6.5 cm×6.5 cm×2.3 cm, and a density of 5.15 g/cm³.

The resultant sinter was shaped to a size of 6.0 cm×6.0 cm×2.0 cm by a dry method and used as the evaporation source for EB vacuum evaporation coating. A uniform $ZrO_2$ film with a smooth surface could be produced consistently and the evaporation source was free from cracks and surface unevenness.

EXAMPLE 2

6120 g of the same $ZrO_2$ powders as used in Example 1 was packed in a rubber mold and subjected directly to cold isostatic pressing to obtain a formed body with a density of 3.15 g/cm³. The formed body thus obtained was dewaxed and sintered under the same condition as in Example 1 to obtain a sinter with a size of 32.8 cm×10.9 cm×3.4 cm and a density of 4.94 g/cm³. The sinter thus obtained could be used similarly as in Example 1 as the evaporation source for EB vacuum evaporation coating with completely no problem.

EXAMPLE 3

1020 g of the same $ZrO_2$ powders as used in Example 1 was preliminarily formed in a metal mold with a size of 20 cmφ, and subjected to cold isostatic pressing, dewaxing and sintering similarly as in Example 1 to obtain sinters with a size of 15.7 cmφ×0.99 cm$^T$ and a density of 5.22 g/cm³. The sinter thus obtained was shaped into a size of 15.24 cmφ×0.635 cm$^T$, join9ed with a copper plate, and used as the target for sputtering with no problem at all to obtain a uniform $ZrO_2$ film consistently.

EXAMPLE 4

$ZrO_2$ powders used as the starting material:

| Purity (including $HfO_2$): 99.9 wt. %, containing CaO: not more than 10 ppm | |
|---|---|
| Particle distribution (in wt. %, determined by the sedimentation method) | |
| Smaller than 1 μm: | 16% |
| 1 to smaller than 10 μm: | 51% |
| 10 to smaller than 40 μm: | 33% |
| Not smaller than 40 μm: | 0% |

To 100 parts by weight of the powder, 2 parts by weight of wax was added to prepare a mixture to be formed. 520 g of the mixture was formed similarly as in Example 1, and the formed body, after dewaxing, was introduced in a sintering furnace and sintered for 6 hours at 1220° C. The sinter thus obtained had a size of 6.6 cm×6.6 cm×2.35 cm, and a density of 4.98 g/cm³. The sinter was then shaped similarly as in Example 1, and could be used as the evaporation source for EB vacuum evaporation coating with no trouble.

EXAMPLE 5

$ZrO_2$ powders used as starting material:

| Purity (including $HfO_2$): 99.8 wt. %, containing CaO: 500 ppm | |
|---|---|
| Particle size distribution (in wt. %, determined by the sedimentation method): | |
| Smaller than 10 μm: | 98% |
| Not smaller than 10 μm: | 2% |

A sinter with a size of 6.45 cm×6.45 cm×2.28 cm was obtained by the same method as in Example 1. The density of the sinter obtained was 5.27 g/cm³, and the sinter could be used as the evaporation source for vacuum evaporation coating with completely no problem.

EXAMPLE 6

$ZrO_2$ powders with used as starting material:

| Purity (including $HfO_2$): 99.8 wt. %, containing CaO: 2000 ppm | |
|---|---|
| Particle size distribution (in wt. %, determined by sedimentation method) | |
| Smaller than 10 μm: | 87% |
| Not smaller than 10 μm: | 13% |

The powders were formed, dewaxed and sintered for 6 hours at 1290° C. by the same method as in Example 3 to obtain a sinter having a size of 16.0 cmφ×1.01 cm$^T$ and a density of 4.92 g/cm³. The sinter thus obtained had no cracks, and could be used as a target for sputtering with completely no trouble.

EXAMPLE 7

$ZrO_2$ powders used as starting material:

| Purity (including $HfO_2$): 99.2 wt. %, containing CaO: 400 ppm | |
|---|---|
| Particle size distribution (in wt. %, determined by the sedimentation method) | |
| Smaller than 1 μm: | 5% |
| 1 to smaller than 10 μm: | 58% |
| 10 to smaller than 40 μm: | 35% |

-continued

| | |
|---|---|
| Purity (including HfO$_2$): 99.2 wt. %, containing CaO: 400 ppm | |
| Particle size distribution (in wt. %, determined by the sedimentation method) | |
| Not smaller than 40 μm: | 2% |

To 100 parts by weight of the ZrO$_2$ powders, 2 parts by weight of wax was added to obtain a mixture to be formed. 3210 g of the mixture was formed under a pressure of 2000 kg/cm$^2$ directly by using a cold isostatic press to obtain a formed body with a density of 3.16 g/cm$^3$. The formed body was introduced in a sintering furnace after dewaxing, and sintered for 6 hours at 1240° C. to obtain a sinter with a size of 13.4 cm×39.8 cm×1.2 cm and with a density of 4.91 g/cm$^3$. No crack was observed in the sinter. The sinter was shaped to a size of 12.7 cm×38.1 cm×0.5 cm by a dry method, joined with a copper plate for cooling, and could be used as a target for sputtering satisfactorily with no problem.

COMPARISON EXAMPLE 1

ZrO$_2$ powders used as starting material:

| | |
|---|---|
| Purity (including HfO$_2$): 99.8 wt. %, containing CaO: not more than 10 ppm | |
| Particle size distribution (in wt. % determined by the sedimentation method) | |
| Smaller than 1 μm: | 42% |
| 1 to smaller than 5 μm: | 48% |
| 5 to smaller than 10 μm: | 7% |
| Not smaller than 10 μm: | 3% |

A sinter was obtained at 1250° C. by the same method as in Example 1. The result was that numerous cracks were observed in the sinter, and the sinter could not be used satisfactorily for forming a thin film therefrom. Therefore, the sintering temperature was changed to 1200° C. to obtain sinter with a size of 7.5 cm×7.5 cm×2.6 cm and a density of 3.42 g/cm$^3$. The sinter thus obtained was shaped to a size of 6.0 cm×6.0 cm×2.0 cm, and used as an evaporation source for EB vacuum evaporation coating. However, numerous cracks were observed in the evaporation source and its surface was uneven, so that no satisfactory ZrO$_2$ film could be obtained.

COMPARISON EXAMPLE 2

ZrO$_2$ powders used as starting material:

| | |
|---|---|
| Purity (including HfO$_2$): 99.5 wt. %, containing CaO: 3000 ppm | |
| Particle size distribution (in wt. % determined by the sedimentation method) | |
| Smaller than 10 μm: | 98% |
| Not smaller than 10 μm: | 2% |

A sinter was obtained by the same method as in Example 1. However, numerous cracks were observed in the resultant sinter.

What is claimed is:

1. Zirconium oxide (ZrO$_2$) sinter for forming a thin film thereof, having a purity not less than 99.0% by weight with unavoidable hafnium oxide (HfO$_2$) as an impurity and a density in the range of 4.9 g/cm$^3$–5.3 g/cm$^3$, wherein said sinter further contains calcium oxide (CaO) in an amount of from 50 ppm to 2,000 ppm.

2. A method for producing zirconium oxide sinter for forming a thin film thereof, said method comprising forming at room temperature and then sintering zirconium oxide powders having a purity not less than 99.0% by weight with unavoidable hafnium oxide as an impurity and having a secondary particle size distribution comprising not less than 30% by weight of particles in the range of 10 μm to smaller than 40 μm, and not less than 2% by weight of particles smaller than 1 μm, wherein the sintering is at a temperature of from 1000° to 1400° C.

3. A method for producing zirconium oxide sinter for forming a thin film thereof, said method comprising forming and then sintering zirconium powders having a purity not less than 99.0% by weight with unavoidable hafnium oxide as an impurity, containing calcium oxide in an amount from 50 to 2000 ppm and having a secondary particle size distribution comprising not less than 30% by weight of particles in the range of 10 μm to smaller than 40 μm, and not less than 2% by weight of particles not smaller than 1 μm, wherein the sintering is at a temperature of from 1000° to 1400° C.

* * * * *